United States Patent [19]
Lur et al.

[11] Patent Number: 5,294,562
[45] Date of Patent: Mar. 15, 1994

[54] TRENCH ISOLATION WITH GLOBAL PLANARIZATION USING FLOOD EXPOSURE

[75] Inventors: Water Lur, Taipei; Nien-Tsu Peng, Hsin Chu; Paul P. W. Yen, Hsin-Chu, all of Taiwan

[73] Assignee: United Microelectronics Corporation, Hsinchu, Taiwan

[21] Appl. No.: 127,054

[22] Filed: Sep. 27, 1993

[51] Int. Cl.$^5$ .............................. H01L 21/76
[52] U.S. Cl. ......................... 437/67; 437/61; 437/63; 148/DIG. 50
[58] Field of Search ............... 437/67, 61, 63; 148/DIG. 50

[56] References Cited
U.S. PATENT DOCUMENTS

| | | | |
|---|---|---|---|
| 4,211,582 | 7/1980 | Horng et al. | 148/1.5 |
| 4,222,792 | 9/1980 | Lever et al. | 437/67 |
| 4,656,497 | 4/1987 | Rogers et al. | 357/50 |
| 4,836,885 | 6/1989 | Breiten et al. | 156/643 |
| 4,868,136 | 9/1989 | Ravaglia | 437/38 |
| 4,876,216 | 10/1989 | Tobias et al. | 437/67 |
| 4,988,639 | 1/1991 | Aomura | 437/67 |
| 5,006,482 | 4/1991 | Kerbaugh et al. | 437/67 |
| 5,017,999 | 5/1991 | Roisen et al. | 357/49 |
| 5,096,848 | 3/1992 | Kawamura | 437/67 |
| 5,108,946 | 4/1992 | Zdebel et al. | 437/72 |
| 5,130,268 | 7/1992 | Liou et al. | 437/67 |
| 5,175,122 | 12/1992 | Wang et al. | 148/DIG. 50 |

FOREIGN PATENT DOCUMENTS

| | | | |
|---|---|---|---|
| 0341898 | 11/1989 | European Pat. Off. | 437/67 |
| 0223346 | 12/1983 | Japan | 437/67 |
| 0236244 | 11/1985 | Japan | 437/67 |
| 0045032 | 2/1987 | Japan | 437/67 |
| 0228730 | 9/1988 | Japan | 437/67 |
| 0016752 | 1/1990 | Japan | 437/67 |

OTHER PUBLICATIONS

VLSI Technology, International Edition, by S. M. Sze, McGraw-Hill Book Co, pp. 473–474 and 476–477.
"Formation of Silicon Nitride at a Si–SiO$_2$ Interface during Local Oxidation of Silicon & during Heat–Treatment of Oxidized Silicon in NH$_2$ Gas" by E. Kooi, J. G. van Lierop and J. A. Appels, J. Electrochem Soc. Solid–State Science and Technology, Jul. 1976, pp. 1117–1120.

*Primary Examiner*—Brian E. Hearn
*Assistant Examiner*—Trung Dang
*Attorney, Agent, or Firm*—George O. Saile

[57] ABSTRACT

A pad silicon oxide layer is deposited over the surface of a silicon substrate. A silicon nitride layer is deposited overlying the pad silicon oxide layer. Portions of the silicon nitride and pad silicon oxide layers not covered by a mask pattern are etched through and into the silicon substrate so as to provide a plurality of wide and narrow trenches within the silicon substrate that will form the device isolation regions. Channel-stops are selectively ion implanted through the openings into the substrate underneath the trenches. The silicon nitride and pad oxide layers are removed. A thin silicon oxide layer is grown conformally on all surfaces of the substrate and within the trenches. A thick layer of silicon oxide is deposited over the surface of the substrate completely filling the trenches wherein the thick silicon oxide layer is planarized over the narrow trenches but is not planarized over the wide trenches. The substrate is coated with a thick layer of photoresist and is subjected to a low dose flood exposure wherein the upper portion of the photoresist is exposed but the lower portion of the photoresist over the wide trenches is not exposed. The upper portion of the photoresist layer is developed and removed. The thick silicon oxide layer is anisotropically etched back to the surface of the substrate wherein the lower portion of the photoresist acts as a mask to prevent etching into the portion of the thick silicon oxide filling the wide trenches and completing the device isolation of the circuit.

27 Claims, 2 Drawing Sheets

TRENCH ISOLATION WITH GLOBAL PLANARIZATION USING FLOOD EXPOSURE

BACKGROUND OF THE INVENTION (1) Field of the Invention

This invention relates to the fabrication of integrated circuit devices and more particularly to a method of local oxidation with global planarization using flood exposure in the fabrication of integrated circuits.

(2) Description of the Prior Art

Local oxidation of silicon is the conventional lateral isolation scheme. The conventional local oxidation process (LOCOS) is described in *VLSI Technology*, International Edition, by S. M. Sze, McGraw-Hill Book Company, NY, NY, c. 1988 by McGraw-Hill Book Co., pp. 473–474. A layer of silicon nitride is deposited over a pad oxide overlying a silicon substrate. The pad oxide is a thin thermal oxide which allows better adhesion between the nitride and silicon and acts as a stress relaxation layer during field oxide formation. The nitride and oxide layers are etched to leave openings exposing portions of the silicon substrate where the local oxidation will take place. A boron channel-stop layer is ion implanted into the isolation regions. The field oxide is grown within the openings and the nitride and pad oxide layers are removed. This completes the local oxidation.

On pp. 476–477 of the aforementioned textbook, Sze describes some of the disadvantages of the growth of field oxide using the local oxidation method. The field oxide will penetrate under the masking nitride layer causing the space between transistors to grow during oxidation. This oxide growth under nitride is called "bird's beak encroachment." Other problems include stress in the oxide in the region covered by the nitride mask, white ribbon effect (a narrow region of nonoxidized silicon), thinning of the field oxide in narrow openings, and a non-recessed surface.

Many new isolation processes have been developed to overcome these drawbacks. Trench isolation schemes are the most attractive candidates. Typically, deep narrow trenches are used to isolate one device from another. Shallow trenches are used to isolate elements within a device, and wide trenches are used in areas where interconnection patterns will be deposited. Unfortunately, simple trench isolation method cannot be implemented on large area openings. A number of solutions to this problem have been proposed. U.S. Pat. No. 4,836,885 to Breiten et al and U.S. Pat. No. 4,876,216 to Tobias et al describe methods for overcoming trench isolation problems using resist etchback techniques. U.S. Pat. No. 4,656,497 to Rogers et al uses reflow of doped glass at high temperatures. U.S. Pat. No. 5,017,999 to Roisen et al, U.S. Pat. No. 5,108,946 to Zdebel et al, and U.S. Pat. No. 5,130,268 to Liou et al describe using reoxidation of solid-phase growth polysilicon. U.S. Pat. No. 4,211,582 to Horng et al and U.S. Pat. No. 4,988,639 to Aomura use two step oxidation with plurality mask techniques and U.S. Pat. No. 4,868,136 to Ravaglia and U.S. Pat. No. 5,096,848 to Kawamura describe a combination of LOCOS and trench techniques. However, in each of these processes there exist some inherent drawbacks such as productivity, repeatability, complexity, and maturity, as well as global planarization.

SUMMARY OF THE INVENTION

A principal object of the invention is to provide an effective and very manufacturable method to locally oxidize the silicon in an integrated circuit.

Another object of the present invention is to provide a method of local oxidation of silicon that will have no "bird's beak" or white ribbon effect.

Yet another object is to provide a method of local oxidation which is free of oxide thinning in narrow openings.

Yet another object of the invention is to provide a method of locally oxidizing the silicon in an integrated circuit whereby a minimum of stress is generated.

Yet another object is to provide a method of local oxidation which incorporates global planarization.

In accordance with the objects of this invention, a new method of local oxidation with global planarization using flood exposure is achieved. A pad silicon oxide layer is deposited over the surface of a silicon substrate. A silicon nitride layer is deposited overlying said pad silicon oxide layer. Portions of the silicon nitride and pad silicon oxide layers not covered by a mask pattern are etched through and into the silicon substrate so as to provide a plurality of wide and narrow trenches within the silicon substrate that will form the device isolation regions. Channel-stops are selectively ion implanted through openings in the patterned silicon nitride and pad silicon oxide layers into the substrate underneath the trenches. The silicon nitride layer and pad silicon oxide layers are removed. A thin silicon oxide layer is grown on all surfaces of the patterned silicon nitride and pad silicon oxide layers and the silicon substrate surfaces within the trenches. A thick layer of silicon oxide is deposited over the surface of the substrate and within the trenches wherein the trenches are completely filled by the thick silicon oxide layer and wherein the thick silicon oxide layer is planarized over the narrow trenches but is not planarized over the wide trenches. The substrate is coated with a thick layer of photoresist and is subjected to a low dose flood exposure wherein the upper portion of the photoresist is exposed but the lower portion of the photoresist over the wide trenches is not exposed. The upper portion of the photoresist layer is developed and removed. The thick silicon oxide layer is anisotropically etched back to the surface of the substrate wherein the lower portion of the photoresist acts as a mask to prevent etching into the portion of the thick silicon oxide filling the wide trenches. The remaining photoresist is removed. A thin silicon oxide layer is grown on the surface of the substrate and the filled trenches and removed completing the device isolation of the integrated circuit.

BRIEF DESCRIPTION OF THE DRAWINGS

In the accompanying drawings forming a material part of this description, there is shown.

DESCRIPTION OF THE PREFERRED EMBODIMENTS

Figure 1:
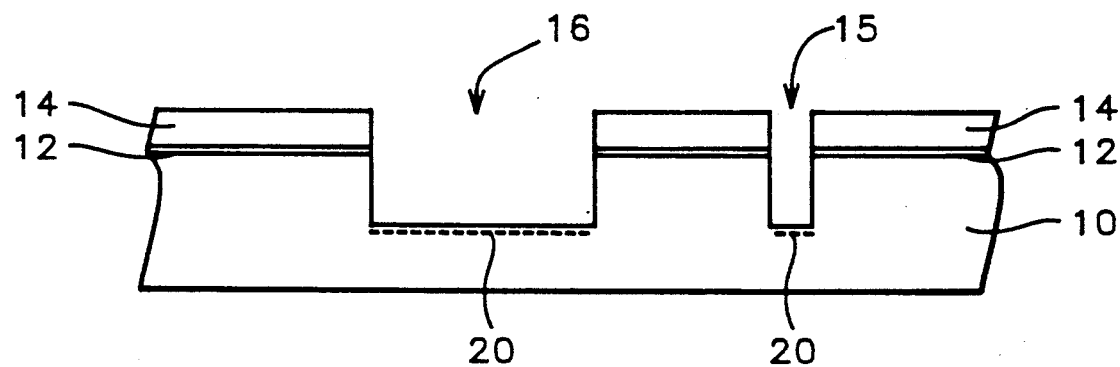
FIGS. 1 through 4 schematically illustrate in cross-sectional representation one preferred embodiment of this invention.

Referring now more particularly to FIG. 1, there is shown a monocrystalline silicon substrate 10. A pad silicon oxide layer 12 is thermally grown or deposited by chemical vapor deposition (CVD) on the surface of the substrate to a preferred thickness of between about 50 to 1000 Angstroms. A layer 14 of silicon nitride is deposited by CVD over the pad silicon oxide layer 12. A field oxide (FOX) mask pattern is laid over the surface of the substrate and the layers 12 and 14 are etched through and into the silicon substrate 10 to provide narrow trenches 15 and wide trenches 16 where the device isolation regions are to be formed. The trenches 15 and 16 have a depth of between about 4000 to 20,000 Angstroms.

Channel-stops 20 are selectively ion implanted into the substrate through the trenches 15 and 16. Boron ions are implanted with a dosage of between about 1 E 13 to 1 E 14 atoms/cm$^2$ and at an energy of between about 10 to 50 KeV. The channel stop implants prevent inversion of p-type silicon under the field oxide.

The silicon nitride layer 14 is removed by dipping the wafer in phosphoric acid at a temperature of between about 150° to 180° C. The pad oxide layer 12 is removed by dipping the wafer in a hydrofluoric acid solution.

Figure 2:
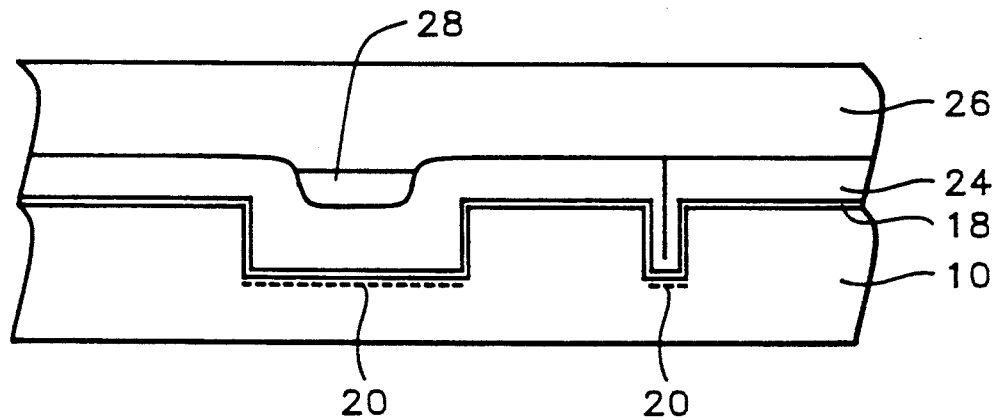

Referring now to FIG. 2, a thin silicon oxide layer 18 is grown in oxygenic ambient at a temperature of between about 700° to 900° C. on the surfaces of the patterned layers and conformally within the trenches 15 and 16. This layer has a thickness of between about 100 to 500 Angstroms. This thin oxide layer 18 is used to remove all defects that are generated during trench etching and just beneath the silicon surface.

A thick layer of silicon dioxide 24 is deposited by CVD over the surface of the substrate and filling both the narrow and wide trenches. This layer is deposited to a thickness of between about 4000 to 20,000 Angstroms. The layer 24 is planarized over the narrow trenches, but is not planarized over the wide trenches.

A layer of photoresist 26 is coated over the surface of the substrate to a thickness of between about 10,000 to 25,000 Angstroms. The substrate is subjected to a low dose flood exposure with a dosage of between about 20 to 100 mJ/cm$^2$. The upper portion of the photoresist 26 will be developed by the low dose flood exposure, but the lower portion 28 above the wide trenches will not be developed because the thickness of photoresist 26 above portion 28 inhibits the dissolution rate of the flood exposure.

Figure 3:
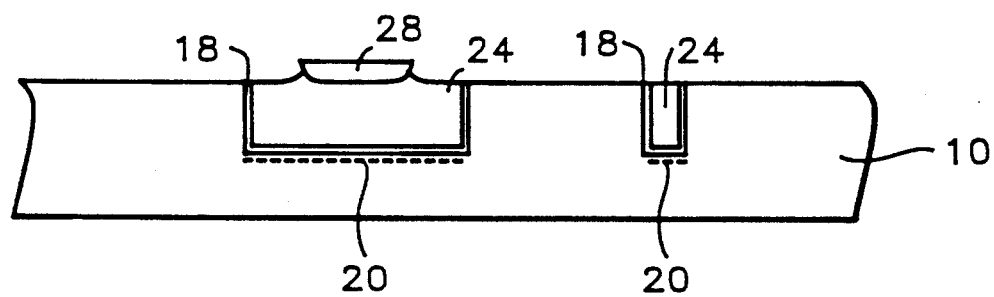

Referring now to FIG. 3, the upper portion of the photoresist 26 that has been developed is removed by an alkaline solution. The silicon dioxide layer 24 is anisotropically etched back to the surface of the silicon substrate by reactive ion etching using $C_2F_6$ or the like. Some of the undeveloped photoresist 28 is also removed by the etchback. The remaining undeveloped photoresist 28 acts as a mask to prevent the etching away of the silicon dioxide within the wide trenches.

Figure 4:
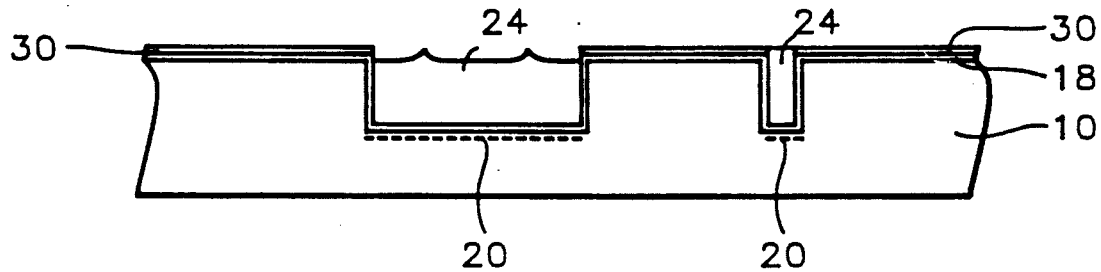

The remaining photoresist 28 is removed by conventional photoresist stripping, $H_2SO_4$ or the like. A sacrificial silicon oxide is grown on the surface of the silicon substrate and then stripped. This sacrificial oxide removes any damage sustained on the silicon surface during the silicon dioxide etchback operation. A gate oxide 30 is formed; shown in FIG. 4.

This completes the device isolation of the integrated circuit. Both wide and narrow openings have been filled and planarized without thinning of oxide in narrow openings. No "bird's beak" or white ribbon effects are produced.

Figure 5:
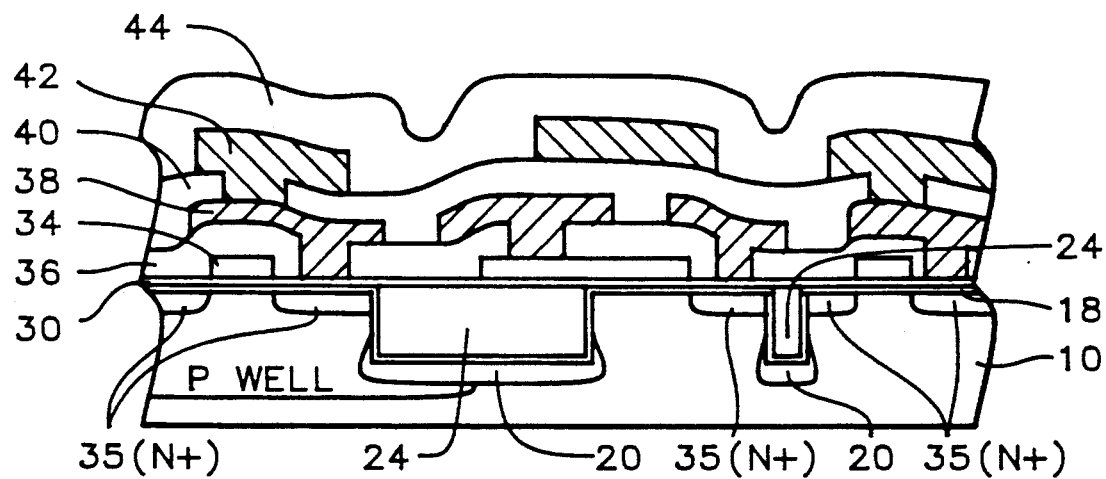
FIG. 5 schematically illustrates in cross-sectional representation a completed integrated circuit of the present invention.

The integrated circuit may be completed as is conventional in the art. For example, referring to FIG. 5, after formation of gate oxide layer 30, the substrate is patterned to provide openings for buried contact regions. A threshold-adjust ion implant may be required at this point, or before the growth of gate oxide layer 30. Next, gate electrode 34 and source/drain regions 35 are fabricated. Dielectric layer 36, which may be a phosphorus-doped chemical vapor deposited oxide or borophosphosilicate glass (BPSG) is deposited. Contact openings ar etched through the dielectric layer to expose the source/drain regions where contacts are desired. Metal layer 38, typically aluminum, is deposited and patterned to complete contacts to the source/drain regions followed by an intermetal dielectric layer deposition 40. A second metallization 42 is deposited and patterned followed by the deposition of a top capping layer 44 of silicon nitride and/or an oxide to complete formation of the integrated circuit.

While the invention has been particularly shown and described with reference to the preferred embodiments thereof, it will be understood by those skilled in the art that various changes in form and details may be made without departing from the spirit and scope of the invention.

What is claimed is:

1. The method of forming device isolation regions of an integrated circuit with global planarization by using flood exposure comprising:

providing a pad silicon oxide layer over the surface of a silicon substrate;

depositing a silicon nitride layer overlying said pad silicon oxide layer;

etching through portions of said silicon nitride, and said pad silicon oxide layers and into said silicon substrate not covered by a mask pattern so as to provide a plurality of wide and narrow trenches within said silicon substrate that will form the said device isolation regions;

selectively ion implanting channel-stops through openings in said patterned silicon nitride and pad silicon oxide layers into said substrate underneath said trenches;

removing said silicon nitride and said pad silicon oxide layers;

growing a thin silicon oxide layer on all surfaces of said substrate;

depositing a thick layer of silicon oxide over the surface of said substrate and within said trenches wherein said trenches are completely filled by said thick silicon oxide layer and wherein said thick silicon oxide layer is planarized over said narrow trenches but is not planarized over said wide trenches;

coating said substrate with a thick layer of photoresist;

subjecting said substrate to a low dose flood exposure wherein the upper portion of said photoresist is developed but the lower portion of said photoresist over said wide trenches is not developed;

removing said upper portion of said photoresist layer;

anisotropically etching back said thick silicon oxide layer to the surface of said substrate wherein said lower portion of said photoresist acts as a mask to prevent etching into the portion of said thick silicon oxide filling said wide trenches;

removing said lower portion of said photoresist;

growing a thin silicon oxide layer on the surface of said substrate; and removing said thin silicon oxide layer completing said device isolation of said integrated circuit.

2. The method of claim 1 wherein said pad silicon oxide layer has a preferred thickness of between about 50 to 1000 Angstroms.

3. The method of claim 1 wherein said silicon nitride layer has a preferred thickness of between about 500 to 4000 Angstroms.

4. The method of claim 1 wherein said silicon nitride and pad silicon oxide layers and said silicon substrate are etched using a reactive ion etch and wherein said trenches extend into said silicon substrate for a depth of between about 4000 to 20,000 Angstroms.

5. The method of claim 1 wherein said silicon nitride and pad silicon oxide layers and said silicon substrate are etched using a plasma etch and wherein said trenches extend into said silicon substrate for a depth of between about 4000 to 20,000 Angstroms.

6. The method of claim 1 wherein said channel-stop implantation uses boron ions at a dosage of between about 1 E 13 to 1 E 14 atoms/cm$^2$ and energy of between about 10 to 50 KeV.

7. The method of claim 1 wherein said thin silicon oxide layer is grown to a thickness of between about 100 to 500 Angstroms.

8. The method of claim 1 wherein said silicon nitride layer is removed by dipping the wafer in phosphoric acid at a temperature of between about 150° to 180° C. and wherein said pad silicon oxide layer is removed by dipping said wafer in a hydrofluoric acid solution.

9. The method of claim 1 wherein said thick layer of silicon oxide is deposited to a thickness of between about 4000 to 20,000 Angstroms.

10. The method of claim 1 wherein said photoresist layer is deposited to a thickness of between about 10,000 to 25,000 Angstroms.

11. The method of claim 1 wherein said low dose flood exposure is performed at an energy of between about 20 to 100 mJ/cm$^2$.

12. The method of claim 1 wherein said upper portion of said photoresist is removed by an alkaline developer.

13. The method of claim 1 wherein said anisotropic etchback of said thick silicon oxide is done by a reactive ion etch.

14. The method of claim 1 wherein after said removing of the photoresist said thin oxide is grown to a thickness of between about 100 to 500 Angstroms.

15. The method of planarizing wide dielectric filled device isolation regions of an integrated circuit by using flood exposure comprising:

providing a pad silicon oxide layer over the surface of a silicon substrate;

depositing a silicon nitride layer overlying said pad silicon oxide layer;

etching through portions of said silicon nitride, and said pad silicon oxide layers and into said silicon substrate not covered by a mask pattern so as to provide a plurality of wide and narrow trenches within said silicon substrate that will form the said device isolation regions;

selectively ion implanting channel-stops through openings in said patterned silicon nitride and pad silicon oxide layers into said substrate underneath said trenches;

removing said silicon nitride and said pad silicon oxide layers;

growing a thin silicon oxide layer on all surfaces of said substrate;

depositing a thick layer of silicon oxide over the surface of said substrate and within said trenches wherein said trenches are completely filled by said thick silicon oxide layer and wherein said thick silicon oxide layer is planarized over said narrow trenches but is not planarized over said wide trenches;

planarizing said wide trenches by first coating said substrate with a thick layer of photoresist;

subjecting said substrate to a low dose flood exposure wherein the upper portion of said photoresist is developed but the lower portion of said photoresist over said wide trenches is not developed;

removing said upper portion of said photoresist layer;

anisotropically etching back said thick silicon oxide layer to the surface of said substrate wherein said lower portion of said photoresist acts as a mask to prevent etching into the portion of said thick silicon oxide filling said wide trenches; and removing said lower portion of said photoresist completing said planarization of said wide trenches.

16. The method of claim 15 wherein said pad silicon oxide layer has a preferred thickness of between about 50 to 1000 Angstroms.

17. The method of claim 15 wherein said silicon nitride layer has a preferred thickness of between about 500 to 4000 Angstroms.

18. The method of claim 15 wherein said silicon nitride and pad silicon oxide layers and said silicon substrate are etched using a reactive ion etch and wherein said trenches extend into said silicon substrate for a depth of between about 4000 to 20,000 Angstroms.

19. The method of claim 15 wherein said silicon nitride and pad silicon oxide layers and said silicon substrate are etched using a plasma etch and wherein said trenches extend into said silicon substrate for a depth of between about 4000 to 20,000 Angstroms.

20. The method of claim 15 wherein said channel-stop implantation uses boron ions at a dosage of between about 1 E 13 to 1 E 14 atoms/cm$^2$ and energy of between about 10 to 50 KeV.

21. The method of claim 15 wherein said thin silicon oxide layer is grown to a thickness of between about 100 to 500 Angstroms.

22. The method of claim 15 wherein said silicon nitride layer is removed by dipping the wafer in phosphoric acid at a temperature of between about 150° to 180° C. and wherein said pad silicon oxide layer is removed by dipping said wafer in a hydrofluoric acid solution.

23. The method of claim 15 wherein said thick layer of silicon oxide is deposited to a thickness of between about 4000 to 20,000 Angstroms.

24. The method of claim 15 wherein said photoresist layer is deposited to a thickness of between about 10,000 to 25,000 Angstroms.

25. The method of claim 15 wherein said low dose flood exposure is performed at an energy of between about 20 to 100 mJ/cm$^2$.

26. The method of claim 15 wherein said upper portion of said photoresist is removed by an alkaline developer.

27. The method of claim 15 wherein said anisotropic etchback of said thick silicon oxide is done by a reactive ion etch.

* * * * *